United States Patent [19]

Oida et al.

[11] Patent Number: 5,647,917
[45] Date of Patent: Jul. 15, 1997

[54] EPITAXY FOR GROWING COMPOUND SEMICONDUCTORS AND AN InP SUBSTRATE FOR EPITAXIAL GROWTH

[75] Inventors: Kazuhiko Oida; Ryusuke Nakai, both of Itami, Japan

[73] Assignee: Sumitomo Electric Industries, Ltd., Osaka, Japan

[21] Appl. No.: 525,423

[22] Filed: Sep. 7, 1995

[30] Foreign Application Priority Data

Sep. 8, 1994 [JP] Japan .................... 6-240680

[51] Int. Cl.$^6$ .................... H01L 29/12
[52] U.S. Cl. .................... 148/33.4; 148/33.5; 148/33.6; 437/105; 437/107; 437/133
[58] Field of Search .................... 148/33.4, 33.5, 148/33.6; 437/105, 107, 133

[56] References Cited

U.S. PATENT DOCUMENTS

| | | | |
|---|---|---|---|
| 5,011,550 | 4/1991 | Konushi et al. | 148/33.4 |
| 5,230,768 | 7/1993 | Furukawa et al. | 437/100 |
| 5,411,915 | 5/1995 | Hamada et al. | 437/105 |
| 5,424,243 | 6/1995 | Takashi | 437/105 |

FOREIGN PATENT DOCUMENTS

| | | |
|---|---|---|
| 0567329 | 10/1993 | European Pat. Off. . |
| 62-88318 | 4/1987 | Japan . |
| 1015914 | 1/1989 | Japan . |
| 64-15914 | 1/1989 | Japan . |
| 64-22072 | 1/1989 | Japan . |
| 1032686 | 2/1989 | Japan . |
| 64-32686 | 2/1989 | Japan . |
| 1-128423 | 5/1989 | Japan . |
| 1-270599 | 10/1989 | Japan . |
| 2-239188 | 9/1990 | Japan . |
| 2-288223 | 11/1990 | Japan . |
| 3-16993 | 1/1991 | Japan . |
| 4-73610 | 11/1992 | Japan . |
| 5-301795 | 11/1993 | Japan . |

*Primary Examiner*—R. Bruce Breneman
*Assistant Examiner*—Ramamohan Rao Paladugu
*Attorney, Agent, or Firm*—Cushman Darby & Cushman, IP Group of Pillsbury Madison & Sutro, LLP

[57] ABSTRACT

When compound semiconductor films are grown on an InP wafer having a surface near a (100) orientation hillocks tend to arise on the films. Off-angle wafers have been adopted for substrates in order to suppress the occurrence of hillocks. The off-angle $\Theta$ from a (100) plane, however, is not the sole factor for determining wheather hillocks will be formed on the film. There is a concealed parameter which determines the generation of hillocks. What induces hillocks on the growing film are the defects on the substrate itself. No hillocks originate on portions of the film that correspond to the portions of the InP wafer without dislocations. The role of the off-angle $\Theta$ of the substrate is preventing the influence of the dislocations from transmitting to the films. A smaller density D of the defects on the substrate allows a smaller off-angle $\Theta$ for suppressing the hillocks from arising. A larger density D of the defects demands a larger off-angle for the substrate so as to prevents the hillocks from originating. An inequality $\Theta \leq 1 \times 10^{-3} D^{1/2}$ allows calculation of the off-angle $\Theta$ for preventing hillocks. More precisely, the inequlity is expressed as $\Theta \leq 1.26 \times 10^{-3} D^{1/2}$.

20 Claims, 4 Drawing Sheets

Hillocks appearing on the top layer
of films grown on InP substrate by OMVPE

Substrate = Fe-doped InP

Etch pits on substrate etched by Huber etching

Substrate = Fe-doped InP

D : dislocation density
Θ : off-angle from (100)
a : height of edge
    (spacing of terraces)

EPITAXY FOR GROWING COMPOUND SEMICONDUCTORS AND AN INP SUBSTRATE FOR EPITAXIAL GROWTH

FIELD OF THE INVENTION

This invention relates to an epitaxial method for suppressing the occurrence of hillocks which are likely to appear on a thin film of a compound semiconductor epitaxially grown on a compound semiconductor substrate in vapor phase. The compound semiconductor substrate includes a GaAs substrate, an InP substrate and so forth. Vapor phase epitaxy is an influential method of growing a compound semiconductor film of either the same component as the substrate or of components different from the substrate material. The vapor phase epitaxy includes MOCVD (Metal-Organic Chemical Vapor Deposition), MBE (Molecular Beam Epitaxy), Chloride CVD or Halide CVD. This invention is capable of being applied to all of the vapor phase epitaxy methods.

BACKGROUND OF THE INVENTION

This application claims a priority based on Japanese patent application No. 6-240680 (240680/'94) filed on Sep. 8, 1994.

Conventional vapor phase epitaxy, in particular, OMVPE (or MOCVD) suffers from the problem that convex defects which are called hillocks appear on surfaces of epitaxially grown films. serveral investigations have been conducted for clarifying the relations between the generation of the defects and serveral factors, which include the surface orientation of substrates, the speed of crystal growth and the temperature of the growth, in order to reduce the number of the hillocks.

For example, Japanese Patent Laying Open No. 2-239188 (239188/'90) mentions to the problem of surface defects called "growth pyramid" or "faceted defects" which arise in the vapor phase epitaxy of compound semiconductors. This prior application describes that the "off-angle" method had been adopted to suppress the occurrence of the surface defects. The off-angle method is a method of growing films epitaxially on a wafer which has an orientation of the surface inclining at 1° to 7° to a (100) plane. Off-angled wafers, however, cannot be adopted for making special devices, for example, laser diodes which require forming gratings on the surface waveguides. The grating having regularly spaced grooves demands a just-(100) wafer as a substrate. The just-(100) wafer referred to herein means a wafer having a surface which correctly corresponds to a (100) plane. An off-angled (100) wafer indicates a wafer having a surface which inclines slightly to a (100) plane. If the inclination angle is α, the wafer is designated as a (100)±α. The application mentions that some of the off-angle wafers were still accompanied by the faceted defects and a lot of faceted defects arose in a small off-angled wafer having an off-angle less than 0.1 degree. Thus Japanese Patent Laying Open No.2-239188 proposes an improvement of vapor phase epitaxy including the processes of preparing an off-angle wafer with a slanting-angle between 0.1° and 0.5° to a (100) plane, maintaining the substrate wafer at a temperature between 600° C. and 700° C., and growing semiconductor films on the heated, off-angled substrate in vapor phase.

Japanese Patent Laying Open No. 5-301795 (301795/93) proposes a method of reducing droplet-defects appearing on the surface of a substrate in an epitaxial growth of compound semiconductors in vapor phase. For decreasing the number of the droplet-defects, the prior art suggests an inequality $$0.011V^{1.5} + 6.21 \times 10^{20} T^{-7.5} \leq \theta \leq 0.20$$

where $\theta$ is the off angle of the wafer from a (100) plane, V is the speed of the epitaxial growth and T is the temperature of the substrate. The application mentions that the defects could be decreased by growing the compound semiconductor films on the wafers which satisfy the inequality. Faster growth demands a higher substrate temperature. Lower growing speed requires a reduction of the substrate temperature to the contrary. This is the meaning of the inequality. It is, however, still unclear why the speed V and temperature T are accompanied with the order of magnitude of 1.5 and −7.5 respectively.

Japanese Patent Laying Open No. 64-32686 (32686/'89) discloses to production of avalanche photodiodes by the halogen transport CVD method. The application discusses the problems of both an occurrence of a lot of hillocks and a big fluctuation of film thickness of the avalanche layer, when InP wafers having a small off-angle less than ±0.1° from a (100) plane were adopted as substrates. Then this prior art suggests an epitaxial growth having the processes of preparing off-angle InP wafers inclining at 0.2 degree to 0.5 degree to a (100) plane, and forming epitaxially a light absorption layer and an avalanche layer of the off-angle substrate wafer. The occurrence of hillocks is reportedly suppressed by the off-angle substrate.

Japanese Patent Laying Open No. 64-22072 (22072/'89) points out the problems of the dispersion of the thicknesses of a window layer and a buffer layer, and of the fluctuation of the depth of pn-junctions, when InP type photodiodes were produced on just-(100) InP wafers by the halogen transport vapor phase epitaxy. The prior art suggests a use of an off-angled InP with an off-angle between 0.2 and 0.5 on which a buffer layer and a light absorption layer were deposited. The application also mentions that the contrivance succeeded in reducing the fluctuation of the film thicknesses and in enhancing the yield of the products.

Japanese Patent Laying Open No. 64-15914 described the problem of the difficulty of controlling the film thickness due to the occurrence of hillocks, when InP photodiodes were produced by growing epitaxially InGaAsP films and so forth on a just-(100) InP wafer by halogen transport CVD method. It reports that the uniformity of the film thickness was improved by growing multi-layered InGaAsP thin films on an off-angle InP wafer inclining at an angle between 0.2 degree and 0.5 degree to a (100) plane.

Japanese Patent Laying Open No. 1-270599 (270599/'89) alludes to the problems of the weak photoluminescence (PL) of a double-hetero structure produced on a just-(100) InP wafer by an MBE method and of the high threshold current of the laser diodes further made on the same double-hereto structure. For avoiding these difficulties, the application suggests a method of fabricating the double-hetero structure by the MBE method on an off-angle InP wafer having a surface slanting at 0.5 degree to 2 degrees to a (111) plane. This prior art provides for using a (111) wafer instead of a (100) wafer, and mentions that the threshold current was reduced by the adoption of the off-angle (111) InP wafer.

Japanese Patent Publication No. 4-73610 (73610/'92) proposes an epitaxial growth of compound semiconductor films on an off-angle GaAs wafer slanting at 0.1 degree to 1 degree to a (111)B plane for making quantum-well laser diodes or high speed FETs based on the two-dimensional electron gas. The inventors state that the inclination of a GaAs wafer ranging from 0.1 degree to 1 degree made the epitaxial films mirror-smooth and enhanced the photoluminescence, and report that the off-angle (111) GaAs wafer was superior to the (001) GaAs wafer.

Japanese Patent Laying Open No. 62-88318 (88318/'87) proposes an epitaxial growth of thin compound semiconductor films on an off-angle (111) GaAs wafer slanting at an angle between 0.1° and 1° to a (111)B plane. It discloses that the thin films deposited on the off-angle (111)B GaAs wafer exhibited stronger photoluminescence than the thin film made on a (001) GaAs wafer.

Japanese Patent Laying Open No. 3-16993 (16993/'91) points out the problem of the ruggedness of thin films epitaxially grown on a just-(100) GaAs wafer in vapor phase. The ruggedness was induced by the striped morphology called "cross-hatching". It states that the cross-hatchings were reduced by adopting an off-angle wafer slanting at an angle between 0.5 degree and 10 degrees to a (100) plane.

Japanese Patent Laying Open No. 2-288223 (288223/'90) points out the problem of the occurrence of rice-grain defects appearing on surfaces of HEMTs (High Electron Mobility Transistor) which were made by growing AlGaAs films on (100) GaAs wafers. According to this application the rice-grain defects were caused by the inclination of the (100) GaAs wafer to a (100) plane. It reports that the deviation of the orientation of the (100) wafer should be less than 0.15 degree, preferably less than 0.05 degree in order to prevent the rice-grain defects from arising on the surfaces. This opinion contradicts to the prior art which have been explained till now.

Japanese Patent Laying Open No. 1-128423 (128423/'89) discloses the employment of an off-angled GaAs wafer slanting at an angle of 0.5 degree to 10 degrees to a (100) plane in order to avoid the ruggedness of the film surfaces brought about by growing a thin films including aluminum on a GaAs wafer either by an MBE method or an MO-MBE method.

PROBLEMS TO BE SOLVED

Almost all of the prior art adopted off-angle InP wafers slanting at a small angle to a (100) plane as a substrate of the epitaxial growth of compound semiconductor films for preventing the surface of the grown films from being rugged. Different reporters recommended different scopes of the slanting angle of an InP wafer to a (100) plane. All of the related art inclined the surfaces of InP wafers to a principal plane (100) for suppressing the ruggedness appearing on the film surfaces.

All of the prior art took account only of the inclination of the film surface to the principal plane (100). No attention, however, has been paid to the relation between the substrate and the films. The prior art deemed that the off-angle substrate had the role of inclining the orientation of the films to the principal plane. They thought the purpose of using an off-angle wafer is to make the films off-angled. Furthermore, the prior art taught us nothing of the relation between the properties of the substrate and the occurrence of hillocks.

By contrast, the inventors of the present invention become aware of a big difference of the density of hillocks appearing on the different films grown on substrates having the same off-angle. Some films indicate a low density of hillocks but other films exhibit a high density of hillocks, even if the films have been deposited on the substrate wafers having the same off-angle. Almost all of the prior art mentioned above defines optimum ranges of the off-angles $\Theta$ from a (100) plane, and explains the density of hillocks would be reduced as a function of the off-angle $\Theta$ of the substrate wafers. Thus the prior art asserts the ruggedness of the epitaxial wafer should be decreased uniformly in accordance with an increase of the off-angle $\Theta$.

The present Inventors, however, dissent from the prevalent opinion. Different substrates having the same off-angle deviating from the same principal plane can provide epitaxial films showing very different degrees of hillocks. The inclination angle of the substrate from the principal plane is not a unique parameter which exclusively rules the occurrence of hillocks. That is, the appearance of hillocks is caused by some reason other than the off-angle of the substrate or the films. The appearance of hillocks is contingent on a certain fact other than the inclination of the film surface to the principal plane. For example, a given substrate with a small off-angle (inclination angle) can have a small density of hillocks in the films grown on the substrate. Other substrate with a big off-angle can have a big density of hillocks in the films deposited on the substrate. What does cause such a reverse relation between the off-angle and the hillock density? There should be a hidden parameter of determining the occurrence of hillocks.

One purpose of the present invention is to clarify the reason why the hillocks are induced on the compound semiconductor films grown on an InP substrate. Another purpose of the present invention is to provide a vapor phase epitaxy of compound semiconductor in which the off-angle is pertinently determined for suppressing the generation of hillocks. A further purpose of the present invention is to provide an epitaxial InP wafer without hillocks. A still further purpose of the present invention is to provide an InP wafer which is immune from hillocks when epitaxial films are grown on it.

SUMMARY OF THE INVENTION

This invention recognizes the affects that the defects on the substrate itself has on the formation of the hillocks in semicondutor films formed thereon. The Inventors have discovered that the density of the hillocks of the film is contingent on the defect density of the substrate itself. The hidden parameter which determines the occurrence of the hillocks turns out to be the density of the inherent defects on the substrate. Further, two elements which determine the density of the hillocks on the film are the inclination angle of the substrate and the density of the inherent defects of the substrate. The Inventors are the first to discovery this relationship.

Accordingly, this invention changes the inclination angle (off-angle) of the substrate as a function of the density of the defects on the substrate for preventing hillocks from originating on the film grown on the substrate. When the substrate has a lower density of the defects, a smaller off-angle of the substrate is allowable. On the contrary, when the density of the defects is higher, a wafer of a larger off-angle shall be chosen for the substrate. Then the minimum off-angle of a wafer can be determined as a function of the defect density on the substrate for hindering hillocks from arising.

What is the function which determines the compensatory relation between the inclination angle and the defect density?

The Inventors have found the following properties controlling the epitaxy of an InP film on an InP substrate wafer.

① When the average EPD (Etch Pit Density) is 25000 $cm^{-2}$ on an InP wafer, no hillock appears on the InP wafer having an off-angle larger than 0.2°.

② When the average EPD is 3000 $cm^{-2}$ on an InP wafer, no hillocks arise on an InP wafer having an off-angle larger than 0.07°.

③ When the average EPD is 1000 $cm^{-2}$ on an InP wafer, no hillocks originate on the InP wafer having an off-angle larger than 0.04°.

Therefore, the minimum inclination angle Θ is contingent upon the density of defects (EPD) on the substrate. The Inventors have deduced a relation governing the occurrence of hillocks from the experiments ①, ② and ③. The relation is simply expressed by an inequality $$\Theta \geq 1.26 \times 10^{-3} D^{1/2}$$

where Θ is an allowable off-angle denoted by the unit of degree (not by the unit of radian), and D is the defect density (EPD) in the unit of cm$^{-2}$ on the wafer. This is a fundamental inequality on which this invention relies.

The defects (dislocations) sometimes disperse irregularly on a wafer such that a microscopic defect density D varies locally on the wafer. In such a random distribution of defects, the expression of the parameters D and Θ with three digits may not be practical. In this case, by taking into account only the uppermost effective number, the inequality is reduced to $$\Theta \geq 1 \times 10^{-3} D^{1/2}.$$

The Inventors have noticed the relation between the defects of the substrate and the occurrence of the hillocks for the first time. Namely, the larger the density of the defects, the higher the probability of the occurrence of the hillocks is. The fewer defects the substrate has, the lower the frequency of the occurrence of the hillocks. When wafers are made by slicing a single crystal ingot, the off-angle Θ of the wafers from (100) plane is first determined and the ingot is cut into wafers in parallel with a plane with the determined off-angle. According to this invention, the minimum inclination angle $\Theta_{min}$ depends on the defect density of the substrate. The dependence is clearly described by the inequality $\Theta \geq 1.26 \times 10^{-3} D^{1/2}$ (more roughly $\Theta \geq 1 \times 10^{-3} D^{1/2}$).

A small density of defects on the substrate allows a small inclination angle Θ for preventing the hillocks from originating. The suppression of the hillocks requires a large inclination angle Θ for the wafers with lots of defects. The optimum off-angle Θ depends on the defect density on the wafers from the standpoint of eliminating the hillocks.

There is, however, a problem. An ingot is sliced into a plurality of as-cut wafers. The as-cut wafers are etched and polished into mirror-wafers with mirror-smooth surfaces. The defects are counted by etching the mirror-wafers with a special etchant enabling dislocations to appear on the surfaces. The defect density cannot be reckoned before being cut into wafers. Thus slicing an ingot precedes counting defects.

An approximate density of defects, however, can be measured by cutting a part of an ingot, obtaining a small sample wafer, etching the sample, and counting the dislocations appearing on the sample wafer after etching. The inclination angle can be determined by the approximate defect density calculated from the sample wafer. Then the ingot can be sliced at the off-angle determined by the defect density measured for the sample wafer. Of course, the defect density fluctuates in the axial direction in the ingot and the defect density of each wafer will be different from the density of the sample wafer. The average density of defects can be surmised by the value of the sample wafer.

Effects of the present invention are now explained. It has been known that the surface of a film becomes rough, if a compound semiconductor film is epitaxially grown on a just (100) InP wafer. It has also been known that the adoption of a small off-angle InP wafer alleviates the roughness of the surface of the film. Semiconductor lasers have sometimes been fabricated on a slightly off-angle InP wafer inclining to a (100) plane. Nobody, however, has been aware of the influence of the dislocations on the InP substrate upon the films grown on the substrate.

This invention points out a strong correlation between the defects (dislocations) on the substrate and the generation of the hillocks for the first time. The defects on the substrate have been deemed to have no relation to the hillocks on the film. The inclination angle (off-angle) can be small enough for suppressing the hillocks, if the substrate has a small density of defects. On the contrary, a wafer with a large density of defects requires a large off-angle for the substrate in order to annihilate the hillocks.

This invention proposes a clear criterion for the off-angle Θ as a function of the defect density D to make a smooth film on an InP wafer. This invention enables an operator to design a correct off-angle in slicing an InP single crystal ingot into a plurality of as-cut wafers. The operator can slice an InP ingot into wafers which are immune from the origination of hillocks by the processes of cutting a small part of the ingot, obtaining a sample wafer, etching the sample wafer by some etchant, measuring the EPD on the sample wafer, determining an optimum off-angle, and cutting the ingot at the determined off-angle. The fabrication of devices, i.e. laser diodes, requires the wafers which have an orientation with the least deviation from a (100) plane. Thus the operator will be able to cut the ingot at the best angle which is the smallest off-angle in the solutions of the inequality.

DETAILED DESCRIPTION OF THE PREFERRED EMBODIMENTS

A set of thin films InP/InGaAs/InP was epitaxially grown on single crystal InP wafers which inclined at a certain off-angle Θ to a (100) plane by the OMVPE (Organometallic Vapor Phase Epitaxy) method. The inclination angles of the wafers ranged from 0° to 0.2°.

In the growth of the films, the substrate was heated at 873 K. The speed of the growth was 1.0 μm/hr. Then the epitaxial wafers were cooled and investigated. The number of hillocks appearing on the uppermost InP film was counted by observation through a microscope. Then the relation between the hillocks on the film and the defects on the substrate was examined. The wafers were classified into three degrees of defects. First kind of wafers had an average defect density (EPD) of 25000 cm$^{-2}$. Second kind of wafers had a smaller average defect density of 3000 cm$^{-2}$. Third kind of wafers had a far smaller average defect density of 1000 cm$^{-2}$.

Figure 1:
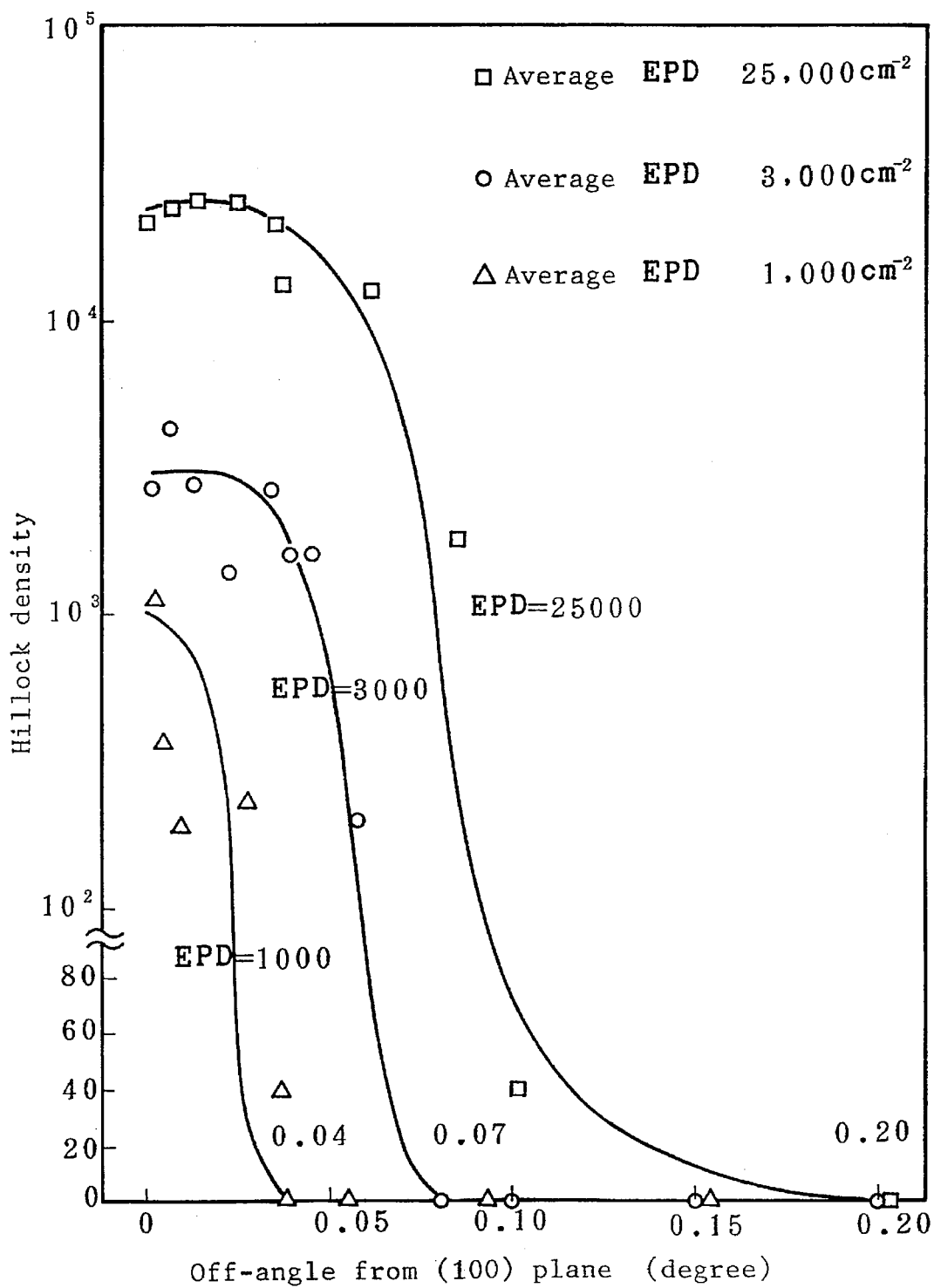
FIG. 1 is a graph showing the relation between the off-angle Θ of an InP substrate and the density of hillocks appearing on the film with a parameter of the defect density of the substrate, when an assembly of films InP/InGaAs/InP is grown epitaxially on the InP substrate.

FIG. 1 shows the relations between the off-angle of the wafers to a (100) plane and the hillock density on the top film as a parameter of the average defect density on the substrate. Blank triangles denote the results of the substrate having an average EPD of 1000 $cm^{-2}$. Blank rounds indicate the results of the substrate of an average EPD of 3000 $cm^{-2}$. Blank squares show the results on the substrate of the average EPD of 25000 $cm^{-2}$.

The wafer of the average EPD of 1000 $cm^{-2}$ has a hillock density of 1000 $cm^{-2}$ on the film when the off-angle is zero, i.e., $\Theta=0$. An increase of the inclination angle $\Theta$ decreased the hillock density drastically. About $\Theta=0.03°$ reduced the hillock density down to 100 $cm^{-2}$. Despite the fluctuation, the hillock density fell to zero at the Inclination angle $\Theta=0.04°$. No hillock appeared on the InP wafer of an off-angle more than 0.04°, if the InP wafer had an EPD less than 1000 $cm^{-2}$.

The InP wafer of the average EPD of 3000 $cm^{-2}$ had a hillock density of 3000 $cm^{-2}$ on the film when the off-angle was zero, i.e., $\Theta=0$. A rise of the inclination angle reduced the hillock density. $\Theta=0.04°$ brought about a low hillock density of about 1000 $cm^{-2}$.

The wafer of the average EPD of 25000 $cm^{-2}$ had a hillock density of 25000 $cm^{-2}$ when the off-angle is zero, i.e., $\Theta=0$. Even at $\Theta=0.04°$, the hillock density on the film was still 25000 $cm^{-2}$. $\Theta=0.07°$ decreased the hillock density down to about 1000 $cm^{-2}$. At $\Theta=0.20°$, the hillock density on the film reduced to zero.

These experiments were performed under conditions that include a growing rate of 1.0 µm/hr and a substrate temperature of T=873 K. (600° C.). This Inventors, however, have confirmed that the same correlation governs the inclination angle and the hillock generation on InP wafers at a temperature between 450° C. and 800° C. at a growth rate between 0.05 µm/hr and 20 µm/hr.

The relation between the hillock generation and the defects on the substrate which the Inventors have found is valid in general for wide ranges of temperature and growing speed.

Figure 2:
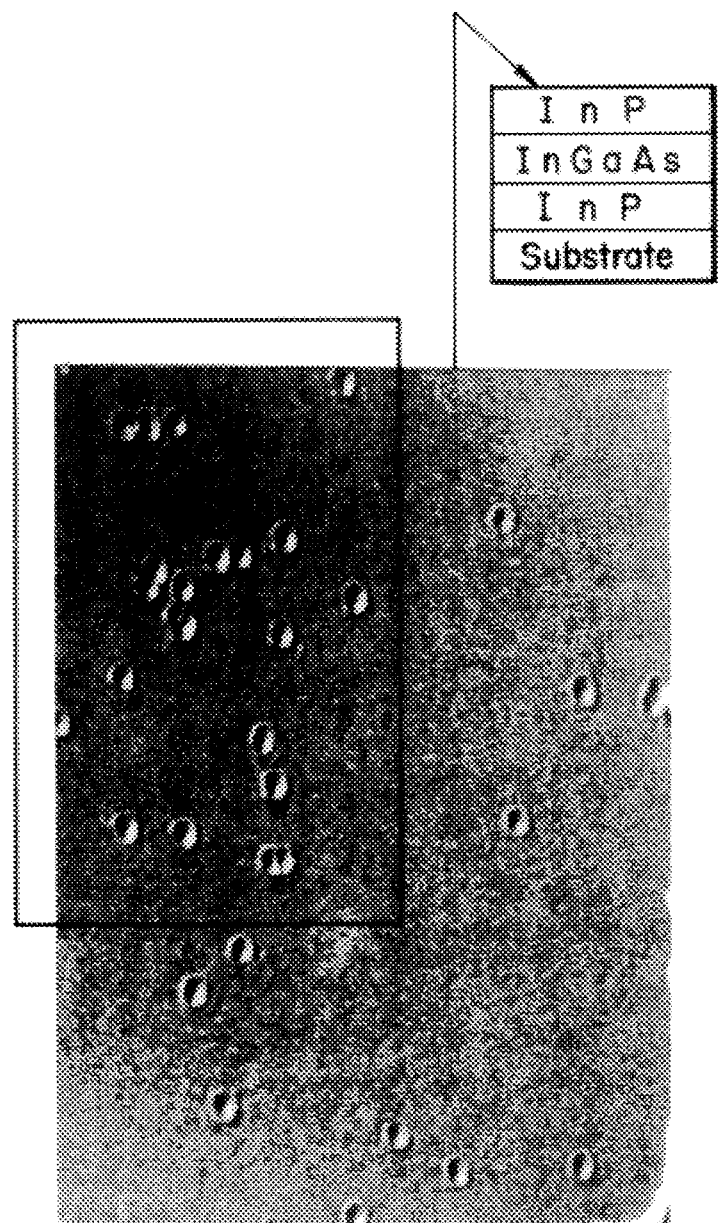
FIG. 2 is a Nomarski microscope photograph on the uppermost InP film epitaxially grown on the InP substrate in the same experiment as in FIG. 1.

An astonishing fact was discovered with respect to the correlation between the defects on the substrate and the hillock generation of the film. FIG. 2 is a Nomarski microscope photograph of the top film of a set of films InP/InGaAs/InP epitaxially grown on a Fe-doped just (100) InP wafer by the OMVPE (Organometallic Vapor Phase Epitaxy). Thus the epitaxial wafer has a multilayered structure of InP/InGaAs/InP/InP(substrate). The layers are denoted at the upper right of FIG. 2. The magnification is approximately 100. The arrow shows the object surface of the observation. Elliptical defects appear on the top InP film. These defects are called hillocks.

Figure 3:
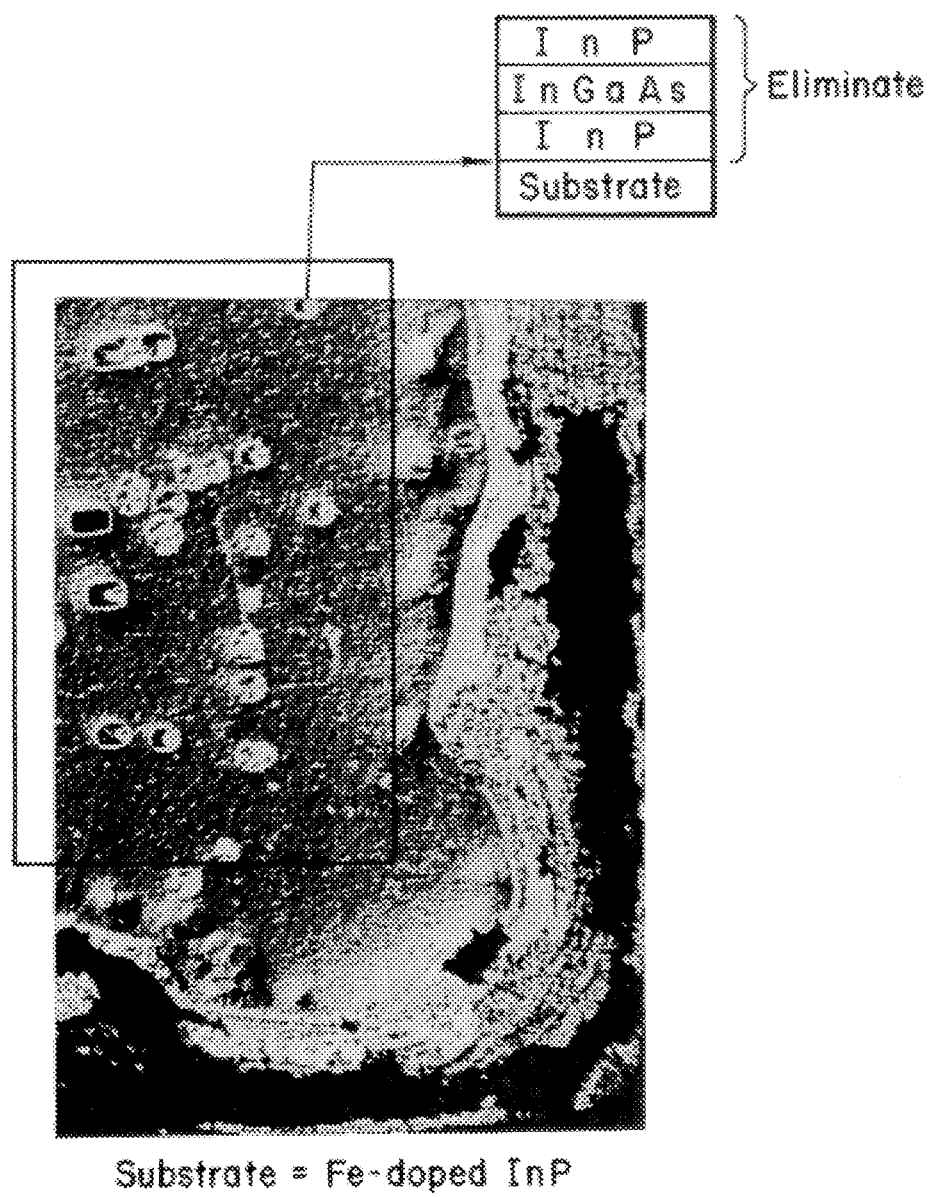
FIG. 3 is a Nomarski microscope photograph of the Hüber-etched substrate revealed by eliminating the films which were grown on the substrate.

Then the InP/InGaAs/InP films were eliminated from the InP substrate. The surface of the substrate emerged. The surface of the substrate was Huber-etched. FIG. 3 is a Nomarski microscope photograph of the Huber-etched surface of the substrate with a magnification of approximately 100. The arrow shows the object surface of the observation.

A comparison reveals a surprising fact that the positions of the hillocks in FIG. 2 correspond one to one to the positions of the defects in FIG. 3. This result indicates that a hillock grows just on a dislocation of the substrate with a zero off-angle $\Theta=0$. Such a dislocation on the substrate triggers a hillock on a film grown on the substrate. The film transcribes the defects on the substrate with hillocks for just (100) wafers. In the case of $\Theta=0$, hillocks all arose on the dislocations of the substrate. The hillocks correspond one to one to the dislocations for non off-angle wafers. Hillocks are transcriptions of the dislocations.

FIG. 1 indicates that the density of hillocks is equal to the density of dislocations (EPD) for all cases at the extremity of $\Theta=0$. The result is attributable to the rigorous correspondence between the hillocks and the dislocations. A hillock is generated by transcribing a dislocation on a just (100) wafer.

However, if the orientation of the substrate deviates from a (100) plane, all the dislocations on the substrate are not transcribed on the film as hillocks. The deviation of the substrate orientation, namely the off-angle seems to have a tendency of erasing the memory of the defects on the substrate (that is, avoid the formation of a hillock at a position on the film that corresponds to a position on the substrate surface that contains a dislocation). The off-angle is negative to the full copy from the dislocations to hillocks. If the substrate has a small density of the dislocations, a small inclination angle is sufficient to erase the memory of the dislocations and to make a smooth film without hillocks. On the other hand, a substrate with a big dislocation density requires a big off-angle so as to erase the memory of the defects of the substrate. The necessary off-angle is contingent on the inherent dislocation density of the substrate.

In any case, the defects on the substrate generate the hillocks on the film. Few hillocks occur on the region without defects. The inclination angle of the substrate from a (100) plane conceals some of the dislocations on the substrate. What prevents the film from transcribing the defects is the inclination angle (off-angle) $\Theta$. The experiments revealed the phenomenal correlation between the defects and the hillocks and gave an effective means for suppressing the occurrence of hillocks.

Why do the hillocks relate to the inclination angle $\Theta$ and the defect density? What does rule the correlation among the off-angle $\Theta$, the defects and the hillocks? This invention is not still self-consistent unless the reason is clarified.

Figure 4:
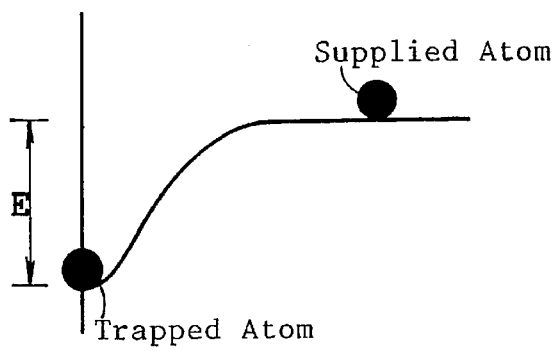
FIG. 4 is a schematic view of the band structure showing the energy state on an atom in a trap level.
Figure 5:
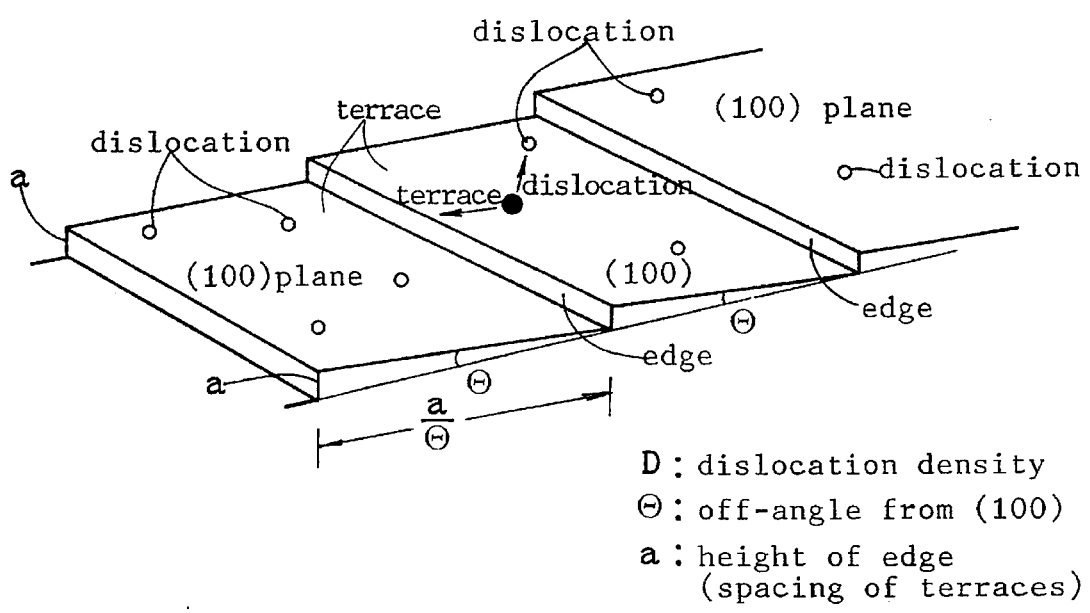
FIG. 5 is a perspective view of terraces for explaining the behavior of an atom, and whether the atom goes into a trap or to the step of the terrace, when an atom falls on the terrace.

The following is the reason that the Inventors surmised. A film is grown on a substrate by the OMVPE method. The atoms which arrive at a spot on the surface of the substrate are either captured at the same place at which they arrive into the lattice structure or displaced to another spot of lower potential and assembled into the lattice structure. FIG. 4 shows a potential curve for explaining the displacement of the supplied atoms. "E" denotes the potential energy of the trap. If the potential E is bigger than the thermal energy kT of the atom, the probability that the atom escapes from the trap is low enough to the trap the atom. Thus the atoms stop in the trap and form a part of lattice structure.

Since the substrate has a definite off-angle $\Theta$ from a (100) plane, the surface of the substrate forms a plurality of parallel steps. The planes parallel with a (100) plane are now called "terraces". The vertical parts are called "edges". The edges of the steps are the singular points for the crystal structure. The potential energy is the lowest at the singular points. Dislocations are defects of the periodic crystal structure. The dislocations have a low potential energy for atoms. Thus the dislocations can also trap atoms. "a" denotes the lattice constant. The terrace has a (100) plane. The height of the edge is "a", because the edge must be a unit of lattice structure. The length L of the terrace is L=a/$\Theta$. L is also a distance between two neighboring edges. The edges are an assembly of parallel lines. The width of the terrace is denoted by "W". The length of the crystal is designated by "S". The area of the substrate is SW.

The flat parts (terraces) have a higher potential and the edges have a lower potential. Thus the terraces scarcely capture atoms because of the higher potential. Accordingly, most of the atoms will be captured either by dislocations or by the edges.

The atoms captured by the dislocations will be localized there and form a hillock, the Inventors surmise. FIG. 2 and FIG. 3 suggest that the hillocks are transcriptions of the dislocations. The hillocks should be made by the successive deposition of atoms on the dislocations. Namely, an abnormal growth on the dislocations makes hillocks.

By contrast, the atoms which are trapped at the edges of the steps form a part of an epitaxial film. When an atom is fixed at the edge, the terrace advances by a volume of an atom. If many atoms align at the edges, the terrace grows forward step by step. An advance of all the terraces by a distance L plies one atomic layer SW further on the substrate, because S/L terraces having a length L are arranged on the substrate and a progress L of the S/L terraces increases the volume of the crystal by LaW×S/L=SaW. Namely, the supply of atoms at the edges contributes to a normal growth.

When the Inclination $\Theta$ of the surface to a (100) plane is small enough, the number of the terraces or the edges is also small. The atoms supplied on the surface have a poor chance of being captured by the step edges. Almost all of the falling atoms will be caught by the dislocations whose number is independent of the inclination $\Theta$. The atoms will form big hillocks on the dislocations. Therefore a small $\Theta$ induces a high density of the hillocks.

As the inclination angle $\Theta$ from a (100) plane gains, the number N of the steps increases according to the equation N=S$\Theta$/a. Thus the increase of the number of the steps heightens the probability of catching atoms by the edges of the steps, and reduces the number of the atoms which are captured in the dislocations. The normal growth on the edges prevails in a big inclination $\Theta$. The influential normal growth suppresses the abnormal growth, i.e. the origination of hillocks.

The mean distance of the paths along which the supplied atoms travel from the falling points to the nearest neighboring dislocations can be estimated by $D^{-1/2}$ which is an inverse of the root of the dislocation density D. By contrast, the mean distance of the paths along which the supplied atoms travel from the falling points to the nearest neighboring edges of the steps can be estimated by a/$\Theta$ which is a length of a terrace. Atoms replenished from the vapor phase will be captured by the nearer singular points (edges or dislocations). When $\Theta$ is small enough, the atoms are assembled at the dislocations. A plenty of hillocks are generated from the dislocations as seeds. When $\Theta$ is big, the atoms gather on the edges, which facilitates the normal growth of the film. Since few atoms are accumulated on the dislocations, few hillocks arise.

The problem which is dominant, the normal growth or the abnormal growth, depends on the relation between a/$\Theta$ and $D^{-1/2}$. These parameters include proportional constants. Then there must exist a critical off-angle $\Theta_o$=KD$^{1/2}$ which gives an equilibrium between the abnormal growth and the normal growth. When the inclination angle $\Theta$ is larger than $\Theta_o$, the normal growth prevails and no hillocks appear. When $\Theta$ is smaller than $\Theta_o$, hillocks originate from the dislocations on the substrate.

According to the measurement practiced by the Inventors, no hillocks occur at an angle $\Theta$ more than 0.04° for a dislocation density D=1000 cm$^{-2}$. No hillocks arise at an angle $\Theta$ more than 0.07° for a dislocation density D=3000 cm$^{-2}$. Similarly no hillocks yield at an angle $\Theta$ higher than 0.2° in a dislocation density D=25000 cm$^{-2}$. The proportional constant K is calculated to be K=1.26×10$^{-3}$deg·cm from these results. A fluctuation and an error sometimes accompany the measurement of the dislocation density. In this case, K=1×10$^{-3}$ deg·cm should be adopted instead of K=1.26×10$^{-3}$ deg·cm, because D cannot be determined by significant figures of three digits.

In the long run, the balance between the attraction force from the dislocations and the attraction force from the edges determines whether the supplied atoms are pulled by the dislocations or by the edges. "R" indicates the number of the atoms positioned on the terraces. "N" is the number of the atoms on the dislocations. "F" denotes the number of the atoms which are supplied to the substrate or the film in a unit time. "$\alpha$" is the probability of the atoms for transferring from the terrace to the edges in a unit time. "$\beta$" is the probability of the atoms for being solidified at the edges. "$\gamma$" means the probability of the atoms for moving from the terrace to the dislocations in a unit time. "$\delta$" is the probability of the atoms of being solidified at the dislocations in a unit time. The following relations hold between the variables.

$$dR/dt=\alpha F-\beta R \tag{1}$$

$$dN/dt=\gamma F-\delta N. \tag{2}$$

F is the speed of the gas supply. Then F can be deemed a constant value. The probability $\alpha$ of the atoms of being captured by the edges which is in proportional to the number of the edges can be expressed by $$\alpha=h\Theta. \tag{3}$$

The probability $\beta$ of the atoms for being solidified on the edges is contingent upon the temperature and the difference of potential between the edges and the terraces. But $\beta$ is independent of the number of the edges. The probability $\gamma$ of the atoms for being captured by the dislocations is in reverse proportion to the distance from the falling point to the nearest dislocation. Namely, the probability $\gamma$ is in proportion to $D^{1/2}$. Then $$\gamma=kD^{1/2}. \tag{4}$$

$\delta$ is independent of the number of the dislocations, because it is the probability of the atoms for being solidified on the dislocations. $\delta$ is a function of the potential energy and the temperature. The differential equations are solved on the condition of keeping the supply F constant and on the initial condition of R=0 and N=0 at t=0.

$$R=(\alpha F/\beta)\{1-\exp(-\beta t)\} \tag{5}$$

$$N=(\gamma F/\delta)\{1-\exp(-\delta t)\} \tag{6}$$

Since the atoms on the edges are solidified at the probability $\beta$ in a unit time and the edges have R atoms, $\beta$R is the number of the atoms solidified on the edges in a unit time. The total number of the atoms solidified at the edges are given by integrating $\beta$R by time parameter t ($\int\beta$Rdt). Similarly $\delta$N is the number of the atoms solidified at the dislocations in a unit time. The total number of the atoms solidified at the dislocations is given by integrating $\delta$N by t ($\int\delta$Ndt). The change depending on time is only a transient change. Thus the total number of the atoms accumulated on the terraces is nearly equal to $\alpha$tF. The atoms solidified on the dislocations are nearly $\gamma$tF.

The discovery of the Inventors is that the atoms growing on the dislocations form the hillocks. According to the opinion of the Inventors, the number of the atoms forming the hillocks is $\gamma tF$. The solidification of $\alpha tF$ atoms at the edges of the steps corresponds to the normal growth of an epitaxial film. In order to make a thin film immune from the hillocks, $\alpha tF$ must be far bigger than $\gamma tF$. Namely, $\alpha$ should be still bigger than $\gamma$ for the fabrication of non-hillock films. The condition is simply expressed by $$h\Theta \gg kD^{1/2}. \tag{7}$$

The condition of suppressing the occurrence of hillocks imposes a condition on $\Theta$ as $\Theta \gg (k/h)D^{1/2}$. The prevention of hillocks demands the off-angle $\Theta$ to be bigger than a value which is in proportion to the square root $D^{1/2}$ of the dislocation density D. This consideration coincides with the actual result. The proportional constant can be determined by the previous experiments. The condition is determined to be $\Theta \geq 1 \times 10^{-3} D^{1/2}$. Otherwise, $\Theta \geq (D/10^5)^{1/2}$.

This physical consideration corresponds to the discovery shown by FIG. 2 and FIG. 3 that the hillocks should be built by the atoms which are captured and solidified on the dislocations. The consideration can qualitatively explain the fact that the dislocation density of the substrate determines the minimum off-angle $\Theta_o$ preventing the hillocks from originating. Such a statistic consideration, however, cannot explain a non-linear and steep dependence on $\Theta$ of the hillock density, as shown in FIG. 1, since it only gives a linear dependence on $\Theta$ of the hillock density.

The assumption that the dislocations and steps compete with each other to attract the atoms supplied by the vapor phase sounds like a truth. But the assumption seems to have an unreasonable point quantitatively.

Now the lattice constant a is assumed to be 0.5 nm and the off-angle $\Theta$ from a (100) plane is also assumed to be 0.1°. Then the width of a terrace is 300 nm. By the way, the dislocation density is assumed to be 25000 cm$^{-2}$. In this case, the average distance between neighboring dislocations is about 60 µm.

Even in such a big dislocation density, the average distance between the nearest neighboring dislocations is about 200 times as long as the length of the terraces. An atom which has fallen at a spot in the middle of neighboring dislocations must climb up or down on about 100 steps of terraces until it reaches the nearest dislocation. The number of dislocations is too small in comparison with the number of the terraces.

Why are the atoms not attracted by the edges during rolling on the terraces and falling at the edges about 100 times? Why does the rapid fall of the hillock density occur at $\Theta=0.09°$ in the case of D=25000 cm$^{-2}$? Why does the avalanche take place at 0.06° in the case of D=3000 cm$^{-2}$? What does induce such a momentary descent at $\Theta=0.03°$ for D=1000 cm$^{-2}$?

FIG. 2 and FIG. 3 indicate that a dislocation has a diameter of about 50 µm. If the terraces have periodic lengths of a period of 0.3 µm, one dislocation pervades more than 100 steps of the terraces. A dislocation has an influence on the potential energy of a wide range of the terraces.

Then "$\beta R$" is now interpreted not as the atoms which are absorbed in the edges but as the height of the terraces. This interpretation is reasonable, because the height of the terraces is in proportion to the number of the atoms piling on the edges. Similarly the "$\delta N$" is interpreted as the height of the hillocks. $\delta N$ has been the number of the atoms accumulated in the dislocations in the previous explanation. The height of the hillocks is obtained by dividing the number of the atoms adsorbed in the dislocations by the area of the dislocations. Since the differential equations are linear about the variables R and N, the equations hold for the variables which are obtained by multiplying R and N by a multiplier.

The dislocations are far large odd-looking structures. The atoms which have once fallen on the dislocations may return back on the terraces. "$\epsilon$" denotes the probability of the return of the atoms from the dislocations to the terraces. On the contrary, some atoms move from the terraces to the dislocations. "$\eta$" is the probability of the movement of the atoms from the terraces to the dislocations. Then the motions of the atoms are explained by the following differential equations $$dR/dt = \alpha F - \beta R + \epsilon N \tag{8}$$

$$dN/dt = \gamma F - \delta N + \eta R. \tag{9}$$

The solutions include time-dependent parts and constant parts. The time-dependent parts rapidly diminish. The solutions soon attain equilibrium values $$R = (\alpha \delta + \gamma \epsilon) F / \Delta \tag{10}$$

$$N = (\beta \gamma + \eta \alpha) F / \Delta \tag{11}$$

$$\Delta = \beta \delta - \epsilon \eta. \tag{12}$$

Here $\Delta$ is positive, because the replacement rate $\epsilon$ from the dislocations to the terraces is far smaller than the solidification rate $\delta$ at the dislocations, and because the replacement rate $\eta$ from the terraces to the dislocations is far smaller than the solidification rate $\beta$ at the edges.

The height $H_1$ of the terraces is $\beta Rt$ (In the strict sense of the word, the height is given by integrating $\beta R$ by time t. But it attains an equilibrium value soon. Thus the integration is $\beta Rt$.)

$$H_1 = \beta(\alpha \delta + \gamma \epsilon) Ft/\Delta. \tag{13}$$

In the similar meaning, the height H2 of the dislocations is $\delta Nt$.

$$H_2 = \delta(\beta \gamma + \eta \alpha) Ft/\Delta. \tag{14}$$

If the height of the dislocations is higher than the height of the terraces, the hillocks will grow indefinitely. On the contrary, if the height of the dislocations is lower than the height of the terraces, the hillocks will be fully covered with the terraces. The annihilation or generation of the hillocks depends on the fact whether $H_1$ is larger than $H_2$ or not. "Q" denotes the difference between $H_1$ and $H_2$.

$$Q = H_1 - H_2 = \{\beta \delta(\alpha - \gamma) + \beta \gamma \epsilon - \eta \alpha \delta\} Ft/\Delta. \tag{15}$$

The sign of Q determines the structure of the film grown on the substrate. Conspicuously different structures are produced by plus Q and minus Q. If Q is positive, the dislocations will be fully covered with an assembly of terraces, since the terraces grow more rapidly than the hillocks. Namely, a positive Q kills the influence of the dislocations and ensures to grow a smooth film without hillocks. Since $\Delta$ is a positive value, the sign (positive or negative) of Q depends only on the sign of the value bracketed. If the values in the bracket are positive, the dislocations disappear and no hillocks grow. Since $\epsilon$ or $\eta$ is trivial, what determines the sign of Q is the difference ($\alpha-\gamma$). Since $\alpha=h\Theta$ and $\gamma=kD^{1/2}$, ($\alpha-\gamma$) is positive, when $\Theta > (k/h)D^{1/2}$. Here the constants k and h are different from the previous constants k and h.

On the contrary, if Q is negative, the abnormal structure on the dislocations grows more rapidly than the terraces. The abnormal structures project on the film and enlarge everlastingly. These abnormal structures on the dislocations are the hillocks. Thus when $\Theta<(k/h)D^{1/2}$, the hillocks appear on the film.

This consideration is capable of explaining the narrow transition area in which the hillock density falls rapidly In FIG. 1 as well as the relation between $\Theta$ and D. In FIG. 1, $\Theta=0$ gives the equation H=D for any value of D. Some inclination angle $\Theta$ rapidly reduces the hillock density H to H=0. Such a quick transition of the hillock density H is induced by a sudden change of the sign of Q which is the difference between the terrace growing speed and the abnormal structure growing speed.

For example, the hillock density H is about 10000 $cm^{-2}$ at $\Theta=0.06°$ in the case of D=25000 $cm^{-2}$. H reduces to about 1000 $cm^{-2}$ at $\Theta=0.07°$. Furthermore, H decreases to 40 $cm^{-2}$ at $\Theta=0.10°$. These rapid fall of H is induced by an abrupt change of the sign of Q at about $\Theta=0.07°$. From $\Theta=0.07°$, the growth speed of the terraces slightly surpasses the growth speed on the dislocations. Even though the difference of the speeds is small, the terraces can cover the abnormal growth on the dislocations. Then the hillocks are concealed by the terraces. Therefore, the sudden change of the hillock density can be consistently explained by the change of the sign of Q.

$\Theta$ must become bigger than $(k/h)D^{1/2}$ for annihilating the hillocks. 0.20° for D=25000 $cm^{-2}$ at which H falls to zero is a value larger than the critical parameter $(k/h)D^{1/2}$ for D=25000 $cm^{-2}$. Similarly 0.07° for 3000 $cm^{-2}$ and 0.04° for D=1000 $cm^{-2}$ are bigger than the values $(k/h)D^{1/2}$ for D=3000 $cm^{-2}$ and D=1000 $cm^{-2}$, respectively.

What we claim is:

1. An epitaxy for growing compound semiconductors comprising the steps of:

measuring a defect density D ($cm^{-2}$) of an InP ingot;

determining an inclination angle $\Theta$ in degrees from a (100) plane by using an inequality $\theta \geq 1\times10^{-3}D^{1/2}$;

cutting at least one substrate from the InP ingot in such a manner that the at least one substrate satisfies the inequality; and growing at least one compound semiconductor film on the at least one InP substrate by a vapor phase epitaxial growth method.

2. An epitaxy as claimed in claim 1, wherein a material of the at least one compound semiconductor film is InP, InGaAsP or InGaAs.

3. An epitaxy as claimed in claim 2, wherein the vapor phase epitaxial method is a Metal-Organic Chemical Vapor Deposition method.

4. An epitaxy as claimed in claim 2, wherein the vapor phase epitaxial method is a Molecular Beam Epitaxy method.

5. An epitaxy as claimed in claim 2, wherein the vapor phase epitaxial method is a Chloride Chemical Vapor Deposition method.

6. An epitaxy as claimed in claim 2, wherein the vapor phase epitaxial method is a Halide Chemical Vapor Deposition method.

7. An epitaxy for growing compound semiconductors comprising the steps of:

measuring a defect density D ($cm^{-2}$) of an InP ingot;

determining an inclination angle $\theta$ in degrees from a (100) plane by using an inequality $\theta \geq 1.26\times10^{-3}D^{1/2}$;

cutting at least one substrate from the InP ingot in such a manner that the at least one substrate satisfies the inequality; and growing at least one compound semiconductor film on the at least one InP substrate by a vapor phase epitaxial growth method.

8. An epitaxy as claimed in claim 7, wherein a material of the at least one compound semiconductor film is InP, InGaAsP or InGaAs.

9. An epitaxy as claimed in claim 8, wherein the vapor phase epitaxial method is a Metal-Organic Chemical Vapor Deposition method.

10. An epitaxy as claimed in claim 8, wherein the vapor phase epitaxial method is a Molecular Beam Epitaxy method.

11. An epitaxy as claimed in claim 8, wherein the vapor phase epitaxial method is a Chloride Chemical Vapor Deposition method.

12. An epitaxy as claimed in claim 8, wherein the vapor phase epitaxial method is a Halide Chemical Vapor Deposition method.

13. An InP wafer having a defect density D and an off-angle $\theta$ from a (100) plane which satisfied an inequality $\theta \geq 1\times10^{-3}D^{1/2}$, wherein D>0.

14. An InP wafer having a defect density D and an off-angle $\theta$ from a (100) plane which satisfied an inequality $\theta \geq 1.26\times10^{-3}D^{1/2}$, wherein D>0.

15. An epitaxy as claimed in claim 2, wherein said measuring step further comprises the step of cutting a portion of the InP ingot to obtain a sample wafer, and wherein said measuring step is performed on the sample wafer of the InP ingot.

16. An epitaxy as claimed in claim 2, wherein said measuring step further comprises the steps of cutting and etching a portion of the InP ingot to obtain a sample wafer, and wherein said measuring step is performed on the sample wafer of the InP ingot.

17. An epitaxy as claimed in claim 2, wherein D>0.

18. An epitaxy as claimed in claim 8, wherein said measuring step further comprises the step of cutting a portion of the InP ingot to obtain a sample wafer, and wherein said measuring step is performed on the sample wafer of the InP ingot.

19. An epitaxy as claimed in claim 8, wherein said measuring step further comprises the steps of cutting and etching a portion of the InP ingot to obtain a sample wafer, and wherein said measuring step is performed on the sample wafer of the InP ingot.

20. An epitaxy as claimed in claim 8, wherein D>0.

* * * * *